(12) United States Patent
Wang et al.

(10) Patent No.: US 10,770,468 B2
(45) Date of Patent: *Sep. 8, 2020

(54) THREE-DIMENSIONAL MEMORY DEVICES AND FABRICATING METHODS THEREOF

(71) Applicant: Yangtze Memory Technologies Co., Ltd., Wuhan, Hubei (CN)

(72) Inventors: Peng Cheng Wang, Hubei (CN); Zhe Wang, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/717,703

(22) Filed: Dec. 17, 2019

(65) Prior Publication Data

US 2020/0126999 A1 Apr. 23, 2020

Related U.S. Application Data

(63) Continuation of application No. 16/169,764, filed on Oct. 24, 2018, now Pat. No. 10,535,669, which is a
(Continued)

(30) Foreign Application Priority Data

Nov. 23, 2017 (CN) .......................... 2017 1 1184323

(51) Int. Cl.
*H01L 27/11509* (2017.01)
*H01L 21/02* (2006.01)
(Continued)

(52) U.S. Cl.
CPC ........ *H01L 27/11509* (2013.01); *G11C 16/08* (2013.01); *H01L 21/02271* (2013.01);
(Continued)

(58) Field of Classification Search
CPC ........... H01L 27/11509; H01L 27/1157; H01L 27/1052; H01L 21/76838; H01L 21/31111;
(Continued)

(56) References Cited

U.S. PATENT DOCUMENTS 5,904,559 A  5/1999 Yu
8,466,068 B2  6/2013 Scheuerlein
(Continued)

FOREIGN PATENT DOCUMENTS

CN   101919046 A   12/2010
CN   103369873 A   10/2013
(Continued)

OTHER PUBLICATIONS

International Search Report and Written Opinion of the International Searching Authority directed to related International Patent Application No. PCT/CN2018/110859, dated Jan. 7, 2019; 7 pages.
(Continued)

*Primary Examiner* — Tri M Hoang
(74) *Attorney, Agent, or Firm* — Sterne, Kessler, Goldstein & Fox P.L.L.C.

(57) ABSTRACT

Embodiments of 3D memory structures and methods for forming the same are disclosed. A method for forming a three-dimensional (3D) memory structure includes forming a dielectric layer on a substrate and forming a first plurality of openings in the dielectric layer at a staircase region of the 3D memory structure. The method also includes forming a second plurality of openings in the dielectric layer at a peripheral device region of the 3D memory structure and forming at least one hard mask layer in the first plurality of openings of the staircase region and in the second plurality of openings of the peripheral device region. The method further includes etching the dielectric layer using the at least
(Continued)

one hard mask layer to form first and second pluralities of via extension regions in top portions of the respective first and second pluralities of openings. The method further includes disposing a first conductive material in the first and second pluralities of openings to form respective first and second pluralities of contact wires. The method also includes disposing a second conductive material in the first and second pluralities of via extension regions to form first and second pluralities of contact pads and forming first and second pluralities of lead wires on the first and second pluralities of contact pads, respectively.

20 Claims, 7 Drawing Sheets

Related U.S. Application Data continuation of application No. PCT/CN2018/110859, filed on Oct. 18, 2018.

(51) Int. Cl.

| | | |
|---|---|---|
| *H01L 23/522* | (2006.01) | |
| *H01L 21/033* | (2006.01) | |
| *H01L 21/311* | (2006.01) | |
| *G11C 16/08* | (2006.01) | |
| *H01L 21/768* | (2006.01) | |
| *H01L 27/105* | (2006.01) | |
| *H01L 27/1157* | (2017.01) | |
| *H01L 27/11582* | (2017.01) | |
| *H01L 27/11575* | (2017.01) | |
| *H01L 27/11573* | (2017.01) | |

(52) U.S. Cl.
 CPC .... *H01L 21/0332* (2013.01); *H01L 21/31111* (2013.01); *H01L 21/76838* (2013.01); *H01L 23/5226* (2013.01); *H01L 27/1052* (2013.01); *H01L 27/1157* (2013.01); *H01L 27/11573* (2013.01); *H01L 27/11575* (2013.01); *H01L 27/11582* (2013.01)

(58) Field of Classification Search
 CPC ............. H01L 21/0332; H01L 23/5226; H01L 21/02271; G11C 16/08
 See application file for complete search history.

(56) References Cited

U.S. PATENT DOCUMENTS

| | | |
|---|---|---|
| 9,754,958 B2 | 9/2017 | Pachamuthu et al. |
| 9,842,851 B2 | 12/2017 | Pachamuthu et al. |
| 10,535,669 B2 * | 1/2020 | Wang ................ H01L 27/11575 |
| 2009/0166682 A1 | 7/2009 | Alsmeier et al. |
| 2010/0090286 A1 | 4/2010 | Lee et al. |
| 2010/0301449 A1 | 12/2010 | Scheuerlein et al. |
| 2011/0049611 A1 | 3/2011 | Kiyotoshi et al. |
| 2013/0264675 A1 | 10/2013 | Scheuerlein |
| 2016/0027795 A1 | 1/2016 | Jung et al. |
| 2016/0104715 A1 | 4/2016 | Pachamuthu et al. |
| 2016/0293625 A1 | 10/2016 | Kang |
| 2016/0307917 A1 | 10/2016 | Yada et al. |
| 2017/0200736 A1 | 7/2017 | Park et al. |
| 2017/0243879 A1 | 8/2017 | Yu et al. |
| 2017/0278864 A1 | 9/2017 | Hu et al. |
| 2018/0261622 A1 | 9/2018 | Jiang et al. |
| 2018/0315769 A1 | 11/2018 | Huo |
| 2018/0374865 A1 | 12/2018 | Shimabukuro et al. |
| 2019/0157280 A1 | 5/2019 | Wang et al. |

FOREIGN PATENT DOCUMENTS

| | | |
|---|---|---|
| CN | 106024798 A | 10/2016 |
| CN | 106601745 A | 4/2017 |
| CN | 106847820 A | 6/2017 |
| CN | 106847823 A | 6/2017 |
| CN | 107946237 A | 4/2018 |
| WO | WO 2019/100875 A1 | 5/2019 |

OTHER PUBLICATIONS

Chinese Application No. 201880005153.7, Office Action dated Jun. 28, 2020; 4 pages.

* cited by examiner

THREE-DIMENSIONAL MEMORY DEVICES AND FABRICATING METHODS THEREOF

CROSS-REFERENCE TO RELATED APPLICATIONS

This application claims priority to Chinese Patent Application No. 201711184323.0, filed on Nov. 23, 2017, PCT Patent Application No. PCT/CN2018/110859, filed on Oct. 18, 2018, U.S. patent application Ser. No. 16/169,764, filed on Oct. 24, 2018 and issued as U.S. Pat. No. 10,535,669 on Jan. 14, 2020, which are incorporated herein by reference in their entirety.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

BRIEF SUMMARY

Embodiments of three-dimensional (3D) NAND memory devices having contact pads and methods for forming the same are described in the present disclosure.

In some embodiments, a method for forming interconnects in a 3D memory structure includes forming target vias and forming via extension regions in top portions of the target vias. The method also includes forming contact wires in the target vias and forming contact pads in via extension regions that are connected to the contact wires. The method further includes forming metal lead wires based on the contact pads and connecting the metal lead wires to the contact wires.

In some embodiments, the via extension regions in top portions of the target vias are formed using a dual damascene process.

In some embodiments, forming via extension regions using a dual damascene process includes forming a hard mask on a 3D memory structure, defining via extension regions using an exposure process, and etching top portions of the target vias to form via extension regions.

In some embodiments, forming hard masks on a 3D memory structure includes sequentially disposing an amorphous carbon layer and a silicon oxynitride layer.

In some embodiments, forming contact wires in target vias and forming contact pads in via extension regions that are connected to the contact wires includes filling metal material in target vias and via extension regions, In this manner the metal material forms contact wires in target vias and contact pads in via extension regions.

In some embodiments, the target vias include staircase vias and peripheral device region vias.

In some embodiments, a 3D memory structure includes target vias and via extension regions in top portions of the target vias. The 3D memory structure also includes contact wires in the target vias and contact pads in the via extension regions, and the contact wires are connected to metal lead wires formed above through contact pads.

In some embodiments, the target vias include staircase region vias and peripheral device region vias.

In some embodiments, a 3D memory device includes the 3D memory structure described herein.

In some embodiments, an electronic device includes the 3D memory device described herein.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
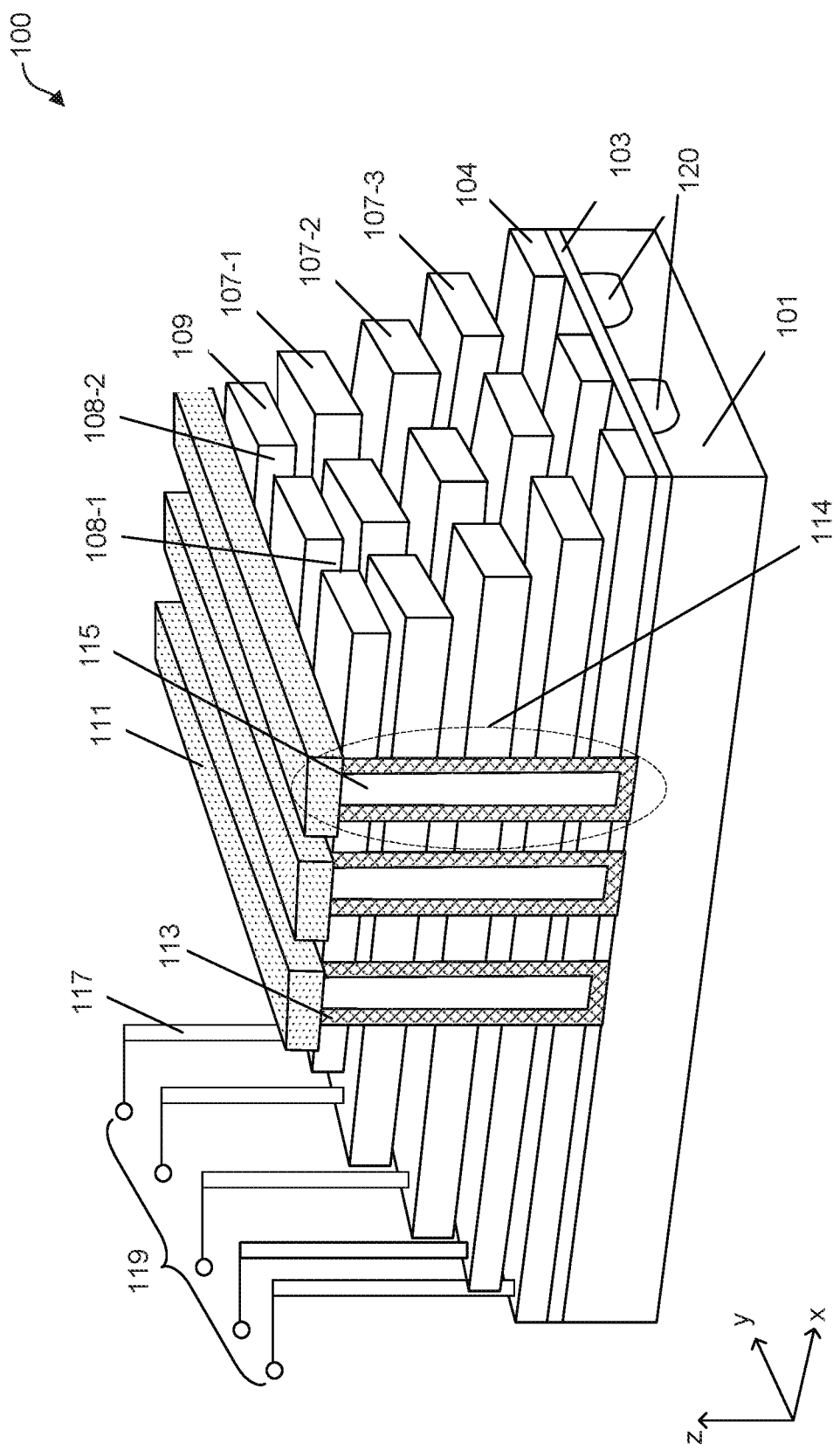
FIG. 1 illustrates a 3D NAND memory structure, in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

As the demand for higher storage capacity continues to increase, the number of vertical levels of the memory cells and staircase structures also increases. Accordingly, it is challenging to balance the manufacturing throughput and the process complexity/cost.

Lithography and etching processes can be used to open contact areas for forming electrical connection in semiconductor structures, such as openings for forming lead wires or vias. For example, in a 3D NAND memory device, electrical connections such as vias or lead wires are formed by disposing conductive material in openings and connected to the conductive layer on each level of the staircase structure. Electrical connections are also formed to connect peripheral circuitry to other device/structures. Other layers and structures such as metal layers and vias are formed on the staircase structure and peripheral circuitry. Exemplary vias can include via 0 connecting the electrical contacts to the M0 metal lines. M0 metal lines can be a local interconnect that represents a first interconnect level and electrically connects to an underlying semiconductor device through a via. Other metal lines can be formed in the metal layers.

Lithography processes for forming vias in 3D NAND memory devices include using a lithographic apparatus, which is a machine that applies a desired pattern onto a substrate, usually onto a target portion of the substrate. For example, lithographic apparatus can include a patterning device, which is alternatively referred to as a mask or a reticle, used to generate a circuit pattern to be formed on an individual layer of the integrated circuit. This pattern can be aligned to a target portion (e.g., staircase structure or peripheral circuitry) on a substrate (e.g., a 3D NAND memory device) and transferred onto the target portion. Transfer of the pattern is typically performed by imaging a pattern onto a layer of radiation-sensitive material (photoresist) provided on the substrate. As device critical dimensions continue to shrink, it is increasingly more challenging to align features during the patterning process, for example, misalignment between vias and contact structures of staircase structures and peripheral circuitry can occur due to various factors such as substrate tensile stress, structural deformation, alignment accuracy, etc. For example, if vias and channel holes are aligned in the active device region, misalignment may occur in the staircase region between the lead wire and contact wires or in the peripheral region between the lead wires and the contact wires that are connected to peripheral devices. Misalignment between vias or conductive structures can lead to a decreased contact surface, which in turn leads to undesirable increase in contact resistance. In some circumstances, misaligned connections can also cause electrical disconnections between electrical wires and result in device failure and low device yield.

To address the above shortcomings, embodiments described herein are directed to contacting structures of a 3D NAND memory device and fabricating methods of the same. The exemplary fabrication method includes forming multiple target via holes in a staircase region and a periphery device region of a 3D NAND memory device. Via extension region can be formed at a top portion of the target via holes and contact pads are formed in the via extension region. A metal connection such as a lead wire can be formed to connect to each via through the corresponding contact pad. In some embodiments, a dual-damascene process can be used to form the contacting structure. The contact pads can be formed simultaneously in the staircase region, and periphery region of the 3D NAND memory device. Contact pads can provide benefits such as enlarged alignment window, which provides an increased contact surface for subsequent alignment between the adjacent conductive structures. Therefore, contact pads can reduce potential misalignment risk, which in turn ensures and improves the performance and yield of the 3D NAND memory devices.

Before describing contact pads in 3D NAND memory devices in detail, an exemplary 3D NAND flash memory device is illustrated in FIG. 1. The flash memory device includes a substrate 101, an insulating layer 103 over substrate 101, a tier of bottom select gate electrodes 104 over insulating layer 103, and a plurality of tiers of control gate electrodes 107 (e.g., 107-1, 107-2, and 107-3) stacking on top of bottom select gate electrodes 104. Flash memory device 100 also includes a tier of top select gate electrodes 109 over the stack of control gate electrodes 107, doped source line regions 120 in portions of substrate 101 between adjacent bottom select gate electrodes 104, and semiconductor channels 114 through top select gate electrodes 109, control gate electrodes 107, bottom select gate electrodes 104, and insulating layer 103. Semiconductor channel 114 (illustrated by a dashed eclipse) includes a memory film 113 over the inner surface of semiconductor channel 114 and a core filling film 115 surrounded by memory film 113 in semiconductor channel 114. The flash memory device 100 further includes a plurality of bitlines 111 disposed on and connected to semiconductor channels 114 over top select gate electrodes 109. A plurality of metal interconnects 119 are connected to the gate electrodes (e.g., 104, 107, and 109) through a plurality of metal contacts 117. During device fabrication, metal interconnects 119 are aligned and connected to metal contacts 117. In some embodiments, metal contacts 117 can be vias formed in insulating layers that are formed between adjacent tiers of gate electrodes. Insulating layers are not shown in FIG. 1 for simplicity. The gate electrodes can also be referred to as the word lines, which include top select gate electrodes 109, control gate electrodes 107, and bottom select gate electrodes 104.

In FIG. 1, for illustrative purposes, three tiers of control gate electrodes 107-1, 107-2, and 107-3 are shown together with one tier of top select gate electrodes 109 and one tier of bottom select gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all top select gate electrodes 109, control gate electrodes 107, and bottom select gate electrodes 104). Further, the same number of metal interconnects is formed to connect to each metal contact 117.

For illustrative purposes, similar or same parts in a 3D NAND memory device are labeled using same element numbers. However, element numbers are merely used to distinguish relevant parts in the Detailed Description and do not indicate any similarity or difference in functionalities, compositions, or locations. The structures 200-600 illustrated in FIGS. 2-6 are each portions of a 3D NAND memory device. Other parts of the memory device are not shown for ease of description. Although using a 3D NAND device as an example, in various applications and designs, the disclosed structure can also be applied in similar or different semiconductor devices to, e.g., reduce the leakage current between adjacent word lines. The specific application of the disclosed structure should not be limited by the embodiments of the present disclosure. For illustrative purposes, word lines and gate electrodes are used interchangeably to describe the present disclosure. In various embodiments, the number of layers, the methods to form these layers, and the specific order to form these layers may vary according to different designs and should not be limited by the embodiments of the present disclosure. It should be noted that the "x" and "y" directions illustrated in these figures are for clarity purposes and should not be limiting.

Exemplary configuration and fabrication processes of word line and peripheral contacts including contact pads are described further in detail below with reference to FIGS. 2-7. Exemplary structures and fabrication processes shown in FIGS. 2-7 can be directed to forming 3D NAND memory devices. The 3D NAND memory devices can include word line staircase regions extending in any suitable direction such as, for example, positive y direction, negative y direction, positive x direction, negative x direction, and/or any suitable directions.

Figure 2:
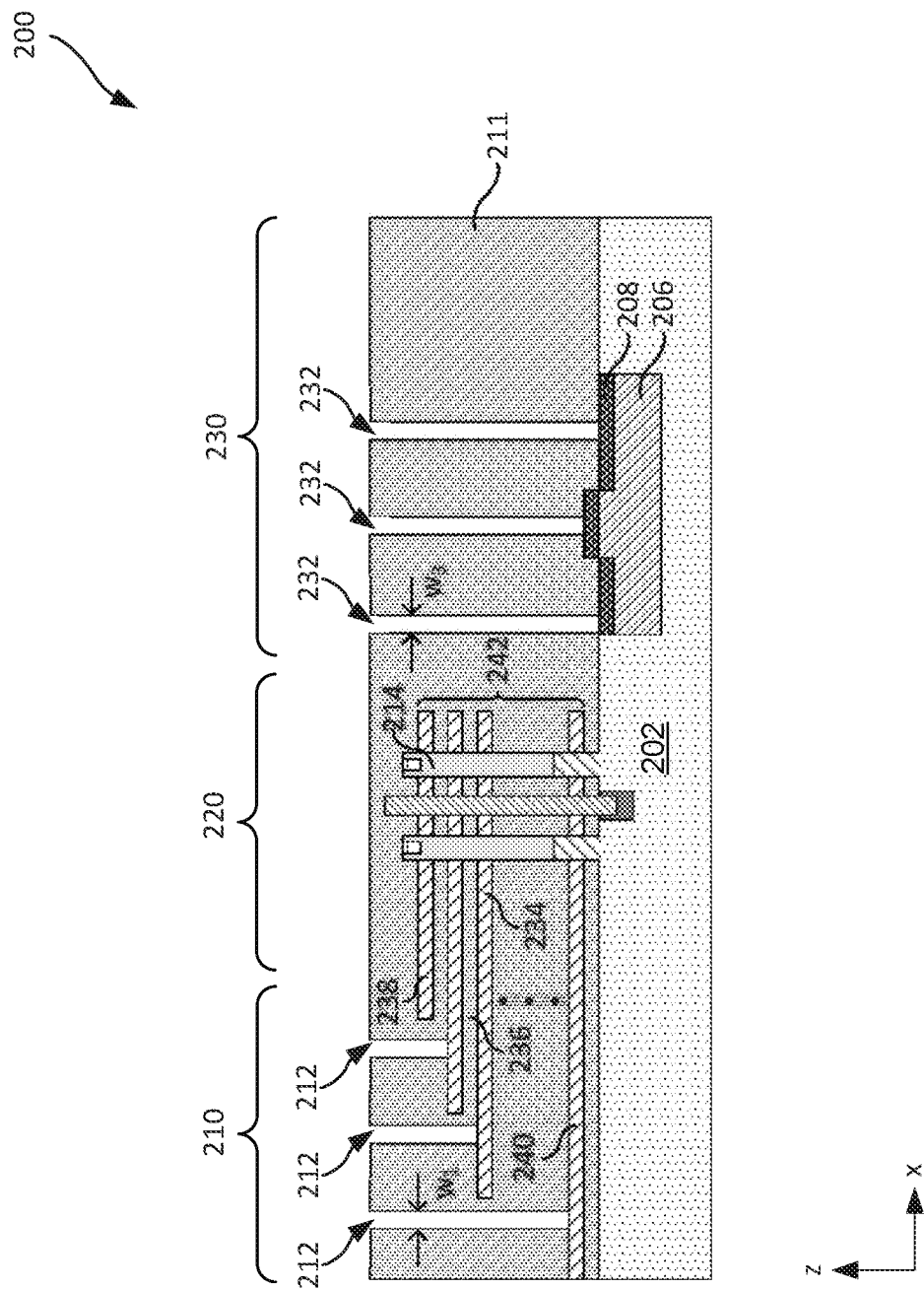
FIGS. 2-6 illustrates exemplary fabrication processes for forming contact pads in via extension regions, in accordance with some embodiments of the present disclosure.

FIG. 2 illustrates a 3D NAND memory structure 200 having dielectric layers and various embedded semiconductor structures, according to some embodiments. 3D NAND memory structure 200 includes a substrate 202 and a dielectric layer 211. For ease of description, 3D NAND memory structure 200 can be divided into three regions: staircase region 210, active device region 220, and peripheral device region 230.

Substrate 202 can include any suitable material for forming a 3D NAND memory structure. In some embodiments, substrate 202 can include silicon, silicon germanium, silicon carbide, silicon on insulator (SOI), germanium on insulator (GOI), glass, gallium nitride, gallium arsenide, any suitable III-V compound material, and/or combinations thereof. Dielectric layer 211 can be formed using any suitable dielectric material such as, for example, silicon oxide, silicon nitride, silicon oxynitride, and/or other suitable dielectric materials. The deposition of dielectric layer 211 can include any suitable methods such as chemical vapor deposition (CVD), physical vapor deposition (PVD), plasma-enhanced CVD (PECVD), sputtering, metal-organic chemical vapor deposition (MOCVD), atomic layer deposition (ALD), and/or combinations thereof. Dielectric layer 211 can include one or more etch stop layers and are not illustrated for ease of description.

A plurality of conductor layer 234 and dielectric layer 236 pairs are formed in staircase region 210 and active device region 220. The plurality of conductor/dielectric layer pairs are also referred to herein as an "alternating conductor/dielectric stack" 242. Conductor layers 234 and dielectric layers 236 in alternating conductor/dielectric stack 242 alternate in the vertical direction. In other words, except the ones at the top or bottom of alternating conductor/dielectric stack 242, each conductor layer 234 can be adjoined by two dielectric layers 236 on both sides, and each dielectric layer 236 can be adjoined by two conductor layers 234 on both sides. Conductor layers 234 can each have the same thickness or have different thicknesses. Similarly, dielectric layers 236 can each have the same thickness or have different thicknesses. In some embodiments, alternating conductor/dielectric stack 242 includes more conductor layers or more dielectric layers with different materials and/or thicknesses than the conductor/dielectric layer pair. Conductor layers 234 can include conductor materials including, but not limited to, W, Co, Cu, Al, doped silicon, silicides, or any combination thereof. Dielectric layers 236 can include dielectric materials including, but not limited to, silicon oxide, silicon nitride, silicon oxynitride, or any combination thereof.

3D NAND memory structure 200 further includes NAND strings 214 formed in active device region 220 and include a plurality of control gates (each being part of a word line). Each conductor layer 234 in alternating conductor/dielectric stack 242 can act as a control gate for each memory cell of NAND string 214. Further, NAND strings 214 can include a select gate 238 (e.g., a drain select gate) at an upper end and another select gate 240 (e.g., a source select gate) at a lower end. As used herein, the "upper end" of a component (e.g., NAND string 214) is the end further away from substrate 202 in the z-direction, and the "lower end" of the component (e.g., NAND string 214) is the end closer to substrate 202 in the z-direction. In some embodiments, select gates 238 and 240 can include conductor materials including, but not limited to, W, Co, Cu, Al, doped silicon, silicides, or any combination thereof.

A peripheral device region 230 can be formed adjacent to active device region 220. The peripheral device region 230 can include a plurality of peripheral devices 206 formed on substrate 202, in which the entirety or part of the peripheral device is formed in substrate 202 (e.g., below the top surface of substrate 202) and/or directly on substrate 202. The peripheral devices 206 can include a plurality of transistors formed on substrate 202. Isolation regions and terminals 208 (e.g., a source region, a drain region, or a gate of the transistor) can be formed in substrate 202 as well.

In some embodiments, the peripheral device can include any suitable digital, analog, and/or mixed-signal peripheral circuits used for facilitating the operation of 3D NAND memory structure 200. For example, peripheral devices 206 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on substrate 202 using complementary metal-oxide-semiconductor (CMOS) technology (also known as a "CMOS chip").

3D NAND memory structure 200 further includes contact structures in staircase region 210, active device region 220, and peripheral device region 230. The contact structures are formed to provide electrical connections to devices embedded in substrate 202 and/or dielectric layer 211. For example, 3D NAND memory device includes one or more word line contacts in staircase region 210. Word line contacts can extend vertically within dielectric layer 211. Each word line contact can have an end (e.g., the lower end) in contact with a corresponding conductor layer 234 in alternating conductor/dielectric stack 242 to individually address a corresponding word line of the array device.

3D NAND memory structure 200 can also include peripheral interconnect structures above peripheral devices 206 to transfer electrical signals to and from peripheral devices 206. Peripheral interconnect structures can include one or more contacts and conductor layers, each including one or more interconnect lines and/or vias. As used herein, the term "contact" can broadly include any suitable types of interconnects, such as middle-end-of-line (MEOL) interconnects and back-end-of-line (BEOL) interconnects, including vertical interconnect accesses (e.g., vias) and lateral lines (e.g., interconnect lines).

To form word line contacts and peripheral interconnect structures, openings are first formed in dielectric layer 211 to expose the corresponding word line of the array device and/or terminals 208 of peripheral devices 206. For example, openings 212 are formed in staircase region 210 through dielectric layer 211 to expose one or more conductor layers 234 of alternating conductor/dielectric stack 242. Width $w_1$ of openings 212 can determine the width of subsequently formed word line contacts. Similarly, openings 232 are formed in peripheral device region 230 through dielectric layer 211 to expose terminals 208 of peripheral devices 206. In some embodiments, width $w_1$ can be in a range between about 0.1 μm and about 0.3 μm. Width $w_3$ of openings 232 can determine the width of subsequently formed peripheral interconnect structures. In some embodiments, width $w_3$ can be in a range between about 0.1 μm and about 0.3 μm. Openings 212 and 232 can be formed using one or more patterning and etching processes. For example, the patterning process can include forming a photoresist layer on dielectric layer 211, exposing the photoresist layer to a pattern, performing post-exposure bake processes, and developing the photoresist layer to form a masking element including the resist. The masking element can protect regions of dielectric layer 211, while one or more etch processes are used to form an opening in dielectric layer 211. The etching process can be a reactive ion etch (RIE) process, a wet etching process, and/or other suitable process. The etching process can continue until the underlying layer is exposed. For example, the etching process for forming openings 212 can continue until the conductor layers 234 are exposed. In some embodiments, the etching process for forming openings 232 can continue until the underlying terminals 208 are exposed.

Figure 3:
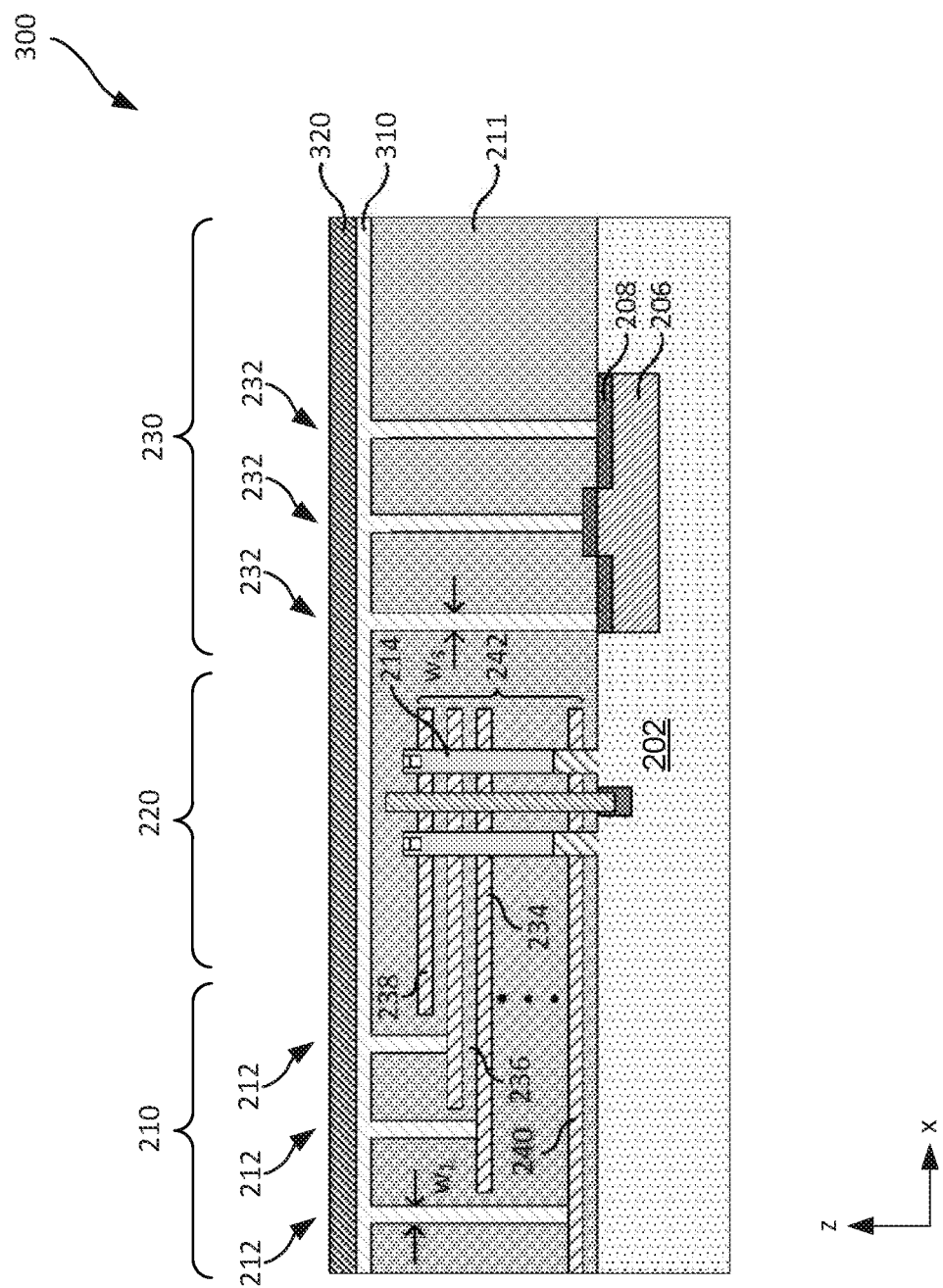

FIG. 3 illustrates a 3D NAND memory structure 300 after forming one or more hard masks, in accordance with some embodiments of the present disclosure. As shown in FIG. 3, 3D NAND memory structure 300 includes a first hard mask 310 disposed on 3D NAND memory structure 200 of FIG. 2, and a second hard mask 320 disposed on first hard mask 310. First hard mask 310 is blanket disposed on all exposed areas of 3D NAND memory structure 200 of FIG. 2, including but not limited to, openings 212 in staircase region 210, openings 232 in peripheral device region 230, top surface of dielectric layer 211, and/other suitable exposed structures. The deposition of first hard mask 310 can include any suitable processes such as, for example, CVD, PVD, PECVD, sputtering, MOCVD, ALD, and/or combinations thereof. First hard mask 310 can be formed using any suitable materials such as, for example, amorphous carbon. In some embodiments, first hard mask 310 can be formed using any suitable materials such as, for example, silicon oxide, silicon nitride, silicon oxynitride, doped silicon oxide, or any combination thereof. In some embodiments, a planarization process such as a chemical mechanical polishing process can be used such that a top surface of first hard mask 310 is substantially level. Second hard mask 320 can be formed on first hard mask 310. For example, second hard mask 320 can be formed by blanket disposing of a suitable material using any suitable processes such as, for example, CVD, PVD, PECVD, sputtering, MOCVD, ALD, and/or combinations thereof. In some embodiments, second hard mask 320 can be formed using any suitable materials such as, for example, silicon oxynitride. In some embodiments, second hard mask 320 can be formed using any suitable materials such as, for example, silicon oxide, silicon nitride, doped silicon oxide, or any combination thereof. In some embodiments, first and second hard mask layers 310 and 320 can be formed using different materials. In some embodiments, first and second hard mask layers 310 and 320 can be formed of amorphous silicon and silicon oxynitride, respectively. In some embodiments, one hard mask layer is needed. However, the combination of first and second hard mask layers 310 and 320 can provide the benefit of, among other things, improved lithography exposure accuracy. This in turn improves the quality and accuracy of subsequent etching processes of dielectric layer 211.

Figure 4:
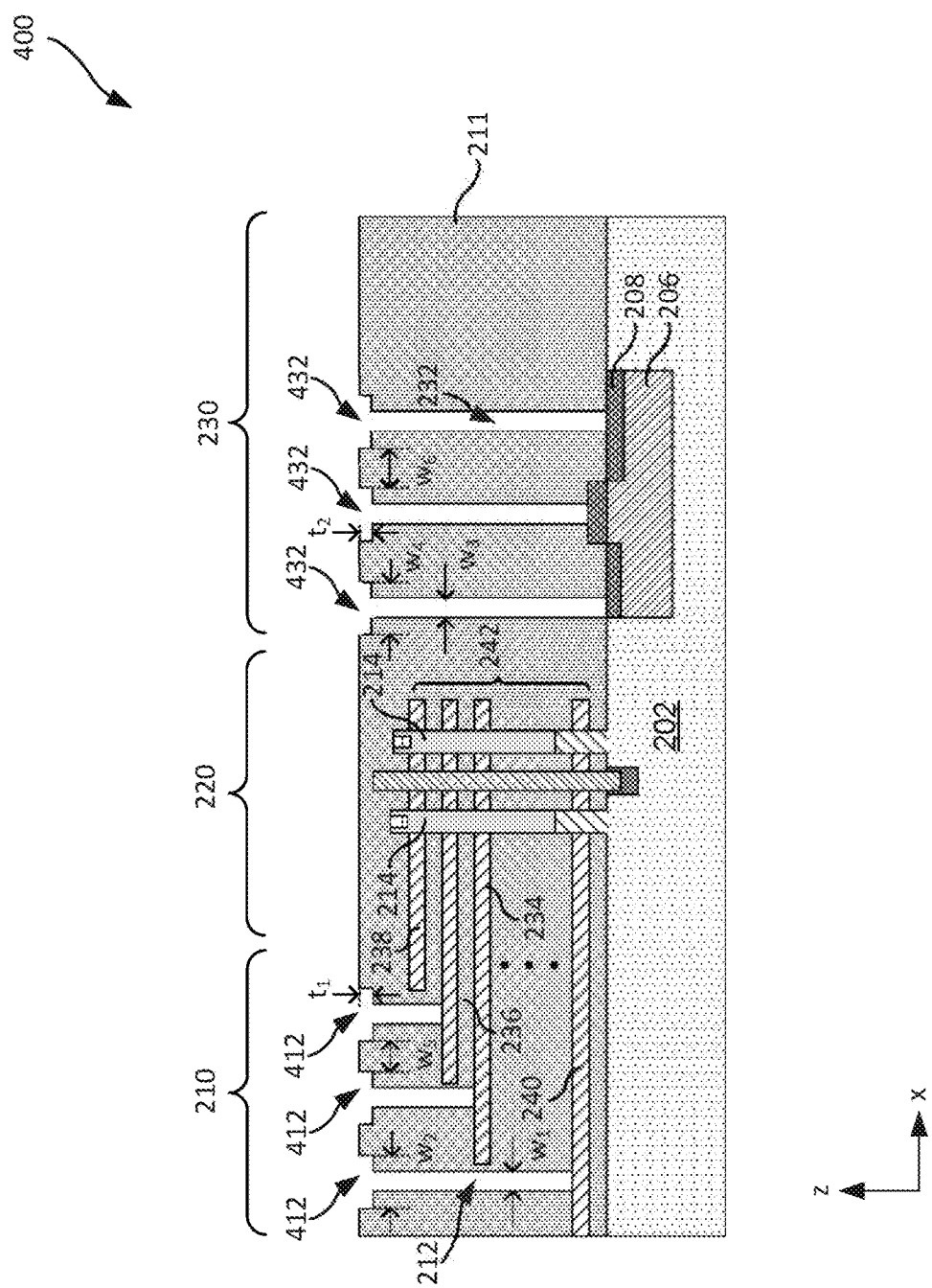

FIG. 4 illustrates a 3D NAND memory structure 400 after forming openings that include via extension regions in top portions of the openings, in accordance to some embodiments of the present disclosure. As shown in FIG. 4, 3D NAND memory structure 400 includes via extension regions 412 over openings 212 in staircase region 210 and via extension regions 432 over openings 232 in peripheral device region 230. In some embodiments, via extension regions 412 and 432 can be formed using one etching process or multi-step etching process that includes etching processes using different etchant chemicals. For example, via extension regions 412 and 432 formed over openings 212 and 232 respectively can be formed using a dual damascene process. In some embodiments, portions of first hard mask layer 320 can be removed by suitable patterning and etching processes, exposing portions of underlying first hard mask 310. The exposed underlying portions of first hard mask 310 can be subsequently etched using suitable etching processes to expose underlying portions of dielectric layer 211. The exposed underlying portions of dielectric layer 211 can be etched using the first and second hard masks 310 and 320 as masks. Patterning processes can include forming a photoresist layer overlying second hard mask 320, exposing the photoresist layer to a pattern, performing post-exposure bake processes, and developing the photoresist layer to form a masking element including the resist. The masking element can protect regions of second hard mask 320, while etching processes can be used to remove portions of first hard mask 310 and dielectric layer 211 to form openings 412 in dielectric layer 211. The etching processes of dielectric layer 211 can include a timed etching process until a nominal depth of via extension region 412 or via extension region 432 is reached. For example, via extension regions 412 in staircase region 210 can have a depth $t_1$ that is in a range between about 0.05 µm and about 0.1 µm. In some embodiments, via extension regions 412 can have a width $w_2$ between about 0.3 µm and about 0.6 µm. In some embodiments, separation $w_5$ between adjacent via extension regions 412 can be in a range about 0.1 µm and about 10 µm. Similarly, via extension regions 432 in peripheral device region 230 can be formed in the same patterning and etching step of via extension regions 412. In some embodiments, via extension regions 432 can have a depth $t_2$ that is in a range between about 0.05 µm and about 0.1 µm. In some embodiments, via extension regions 432 can have a width $w_4$ between about 0.1 µm and about 10 µm. In some embodiments, separation $w_6$ between adjacent via extension regions 432 can be in a range about 0.1 µm and about 10 µm. After via extension regions and openings are formed, first and second hard masks 310 and 320 are removed by any suitable etching processes.

Figure 5:
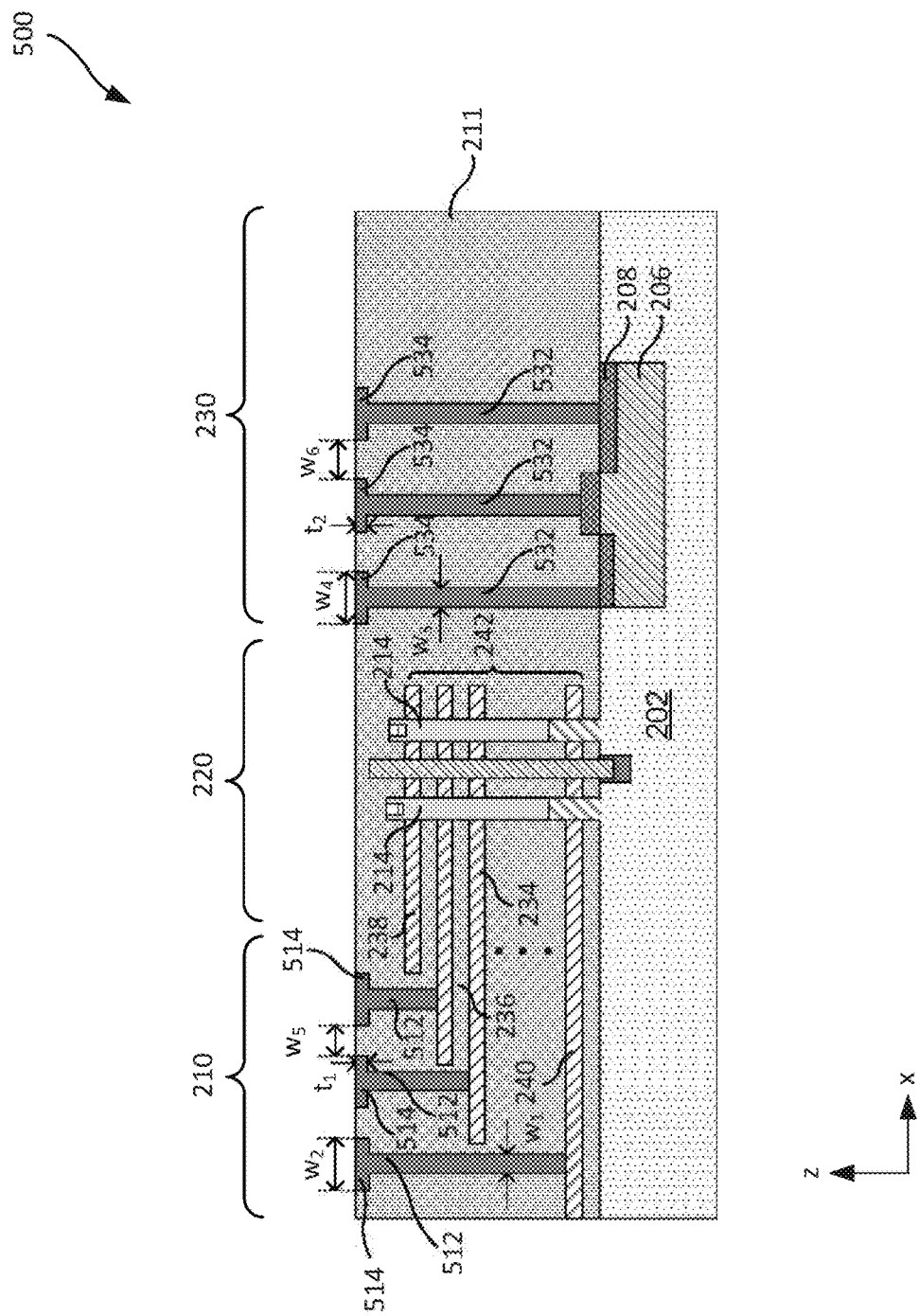

FIG. 5 illustrates a 3D NAND memory structure 500 after filling the openings and via extension regions that are formed in top portions of the openings, in accordance to some embodiments of the present disclosure. As shown in FIG. 5, 3D NAND memory structure 500 includes contact pads formed in via extension regions and conductive structures in openings. For example, contact pads 514 are formed in via extension regions 412 and conductive structures 512 are formed in openings 212 of staircase region 210. Similarly, contact pads 534 are formed in via extension regions 432 and conductive structures 532 are formed in openings 232 of peripheral device region 230. In some embodiments conductive structures 512 can be contact wires, and contact pads and conductive structures can be collectively referred to as word line contacts. Contact pads 514 and 534 as well as conductive structures 512 can be formed by disposing a conductive material in the exposed via extension regions and openings until the via extension regions and openings in FIG. 4 are completely filled. In some embodiments, the conductive material can overflow onto the top surface of dielectric layer 211. In some embodiments, a planarization process such as a chemical mechanical polishing process can be used to remove the overflow conductive material such that the top surfaces of contact pads 514 and 534 and dielectric layer 211 are substantially level (e.g., coplanar). Contact pads 514 and 543 and conductor structures 512 and 532 can include conductor materials including, but not limited to, tungsten (W), cobalt (Co), copper (Cu), aluminum (Al), silicides, or any combination thereof. In some embodiments, the conductive material can be disposed using any suitable deposition method such as, for example, for example, CVD, PVD, PECVD, sputtering, MOCVD, ALD, and/or combinations thereof. In some embodiments, a conductive material formed in the openings can be different from a conductive material formed in the via extension regions. For example, a first conductive material can be disposed in the openings using any suitable deposition methods, and a second conductive material can be disposed on the first conductive material and in the via extension regions using any suitable deposition methods. In some embodiments, more than two conductive materials can be disposed in the openings and via extension regions. In some embodiments, other layers such as barrier layers, liners, can be disposed in the openings and via extension regions and are not illustrated for ease of description.

Figure 6:
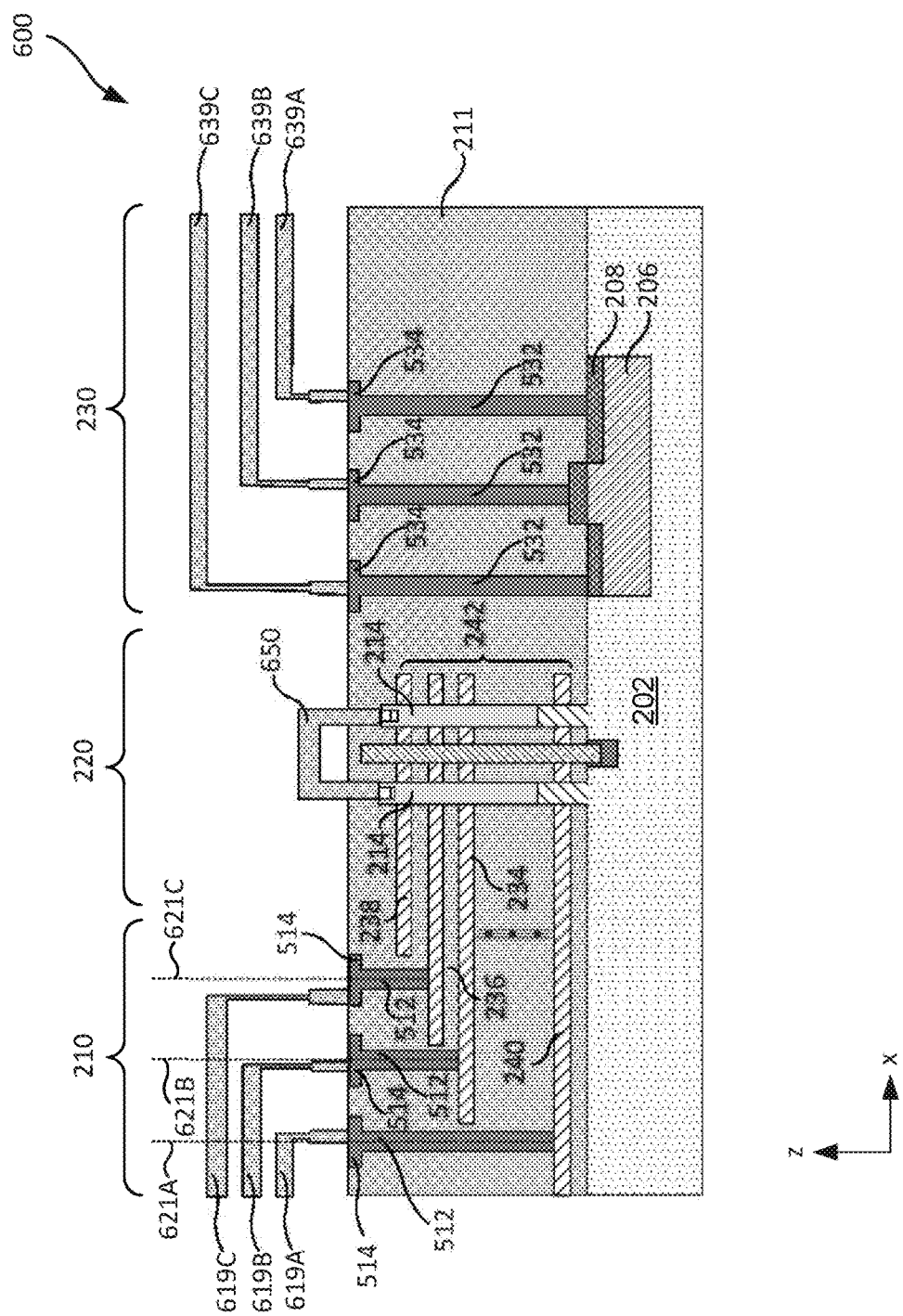

FIG. 6 illustrates a 3D NAND memory structure 600 after lead wires are formed and electrically connected to various conductive structures, in accordance to some embodiments of the present disclosure. As shown in FIG. 6, lead wires 619A-619C are formed in staircase region 210, lead wire 650 is formed in active device region 220, and lead wires 639A-639C are formed in peripheral device region 230, in accordance to some embodiments. Using lead wires 619A-619C as an example, each lead wire is electrically connected to a corresponding contact pad 514. As shown in FIG. 6, lead wires 619A-619C may not be fully aligned with underlying conductive structures 512 since the central axis of lead wires offsets from their respective central axis 621A-621C of underlying conductive structures 512. As shown in FIG. 6, lead wire 650 is aligned to NAND string 214. Due to various factors such as substrate tensile stress, lead wires 619A-619C and 639A-639C may not fully align to underlying conductive structures 512 and 532, respectively. However, contact pads 514 provide additional alignment window such that electrical connections can be established between lead wires 619A-619C and selected conductive layers 234 as long as wires 619A-619C electrically contact their respective contact pads even if lead wires 619A-619C are not fully aligned with conductive structures 512. Similarly, in peripheral device region 230, lead wires 639A-639C are electrically coupled (e.g., conductively connected) to terminals 208 as long as lead wires 639A-639C are electrically connected to contact pads 534 even if lead wires 639A-639C are not fully aligned with conductive structures 532.

Figure 7:
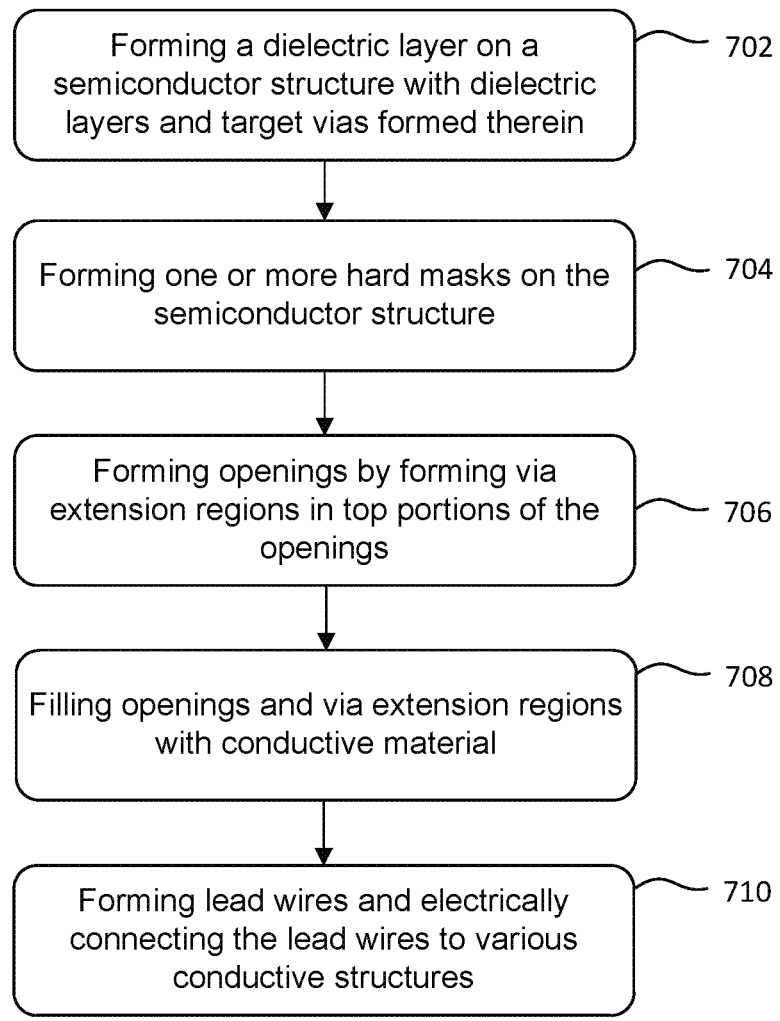
FIG. 7 is a flow diagram illustrating exemplary methods for forming contact pads in via extension regions, in accordance with some embodiments of the present disclosure.

FIG. 7 is a flow diagram of an exemplary method 700 of forming conductive structures in 3D NAND memory devices, in accordance with some embodiments of the present disclosure. Based on the disclosure herein, operations in method 700 can be performed in a different order and/or vary.

At operation 702, a semiconductor structure having dielectric layers and target vias is formed, in accordance with some embodiments. An example of the semiconductor structure can be a 3D NAND memory structure including a substrate and a dielectric layer. The substrate can include silicon, silicon germanium, silicon carbide, SOI, GOI, glass, gallium nitride, gallium arsenide, any suitable III-V compound material, and/or combinations thereof. The dielectric layer can be formed using silicon oxide, silicon nitride, silicon oxynitride, and/or other suitable dielectric materials. A plurality of conductor layer and dielectric layer pairs are formed in a staircase region and an active device region of the 3D NAND memory structure. In some embodiments, alternating conductor/dielectric stack 242 includes more conductor layers or more dielectric layers with different materials and/or thicknesses than the conductor/dielectric layer pair. The conductor layers can include, W, Co, Cu, Al, doped silicon, silicides, or any combination thereof. The dielectric layers can include silicon oxide, silicon nitride, silicon oxynitride, or any combination thereof 3D NAND memory device further includes NAND strings formed in the active device region and include a plurality of control gates. A peripheral device region can include a plurality of peripheral devices formed on the substrate. The peripheral devices can include a plurality of transistors formed on the substrate. Isolation regions and doped regions can also be formed in the substrate. Target vias can be formed in the staircase to expose selected conductive layers of the alternating conductor/dielectric stack. In some embodiments, target vias can be formed in the peripheral device region to expose selected doping regions or terminals of embedded semiconductor devices.

At operation 704, one or more hard masks are formed on the structure, in accordance to some embodiments of the present disclosure. The 3D NAND memory structure can include a first hard mask layer and a second hard mask layer disposed on the first hard mask layer. The first hard mask layer is blanket disposed on all exposed areas of 3D NAND memory structure. The deposition of the first hard mask can include any suitable processes. The first hard mask can be formed using any suitable materials such as, for example, amorphous carbon. In some embodiments, a planarization process such as a chemical mechanical polishing process can be used such that a top surface of the first hard mask is substantially level. A second hard mask can be formed on the first hard mask using any suitable materials such as, for example, silicon oxynitride. In some embodiments, the first and second hard mask layers can be formed using different materials. In some embodiments, the first and second hard mask layers can be formed of amorphous silicon and silicon oxynitride, respectively.

At operation 706, openings are formed in the structure and includes via extension regions in top portions of the openings, in accordance to some embodiments of the present disclosure. Via extension regions are formed over the openings in the staircase region and via extension regions are formed over the openings in the peripheral device region. In some embodiments, the via extension regions can be formed using one etching process or multi-step etching process. For example, the via extension regions formed over the openings can be formed using a dual damascene process. Via extension regions in the staircase region can have a depth that is in a range between about 0.05 μm and about 0.1 μm. In some embodiments, the via extension regions in the staircase region can have a width between about 0.3 μm and about 0.6 μm. In some embodiments, separations between adjacent via extension regions in the staircase region can be in a range about 0.1 μm and about 10 μm. Similarly, via extension regions in the peripheral device region can be formed in the same patterning and etching step of the via extension regions formed in the staircase region. In some embodiments, via extension regions in the peripheral device region can have a depth that is in a range between about 0.05 μm and about 0.1 μm. In some embodiments, the via extension regions peripheral device region can have a width $w_4$ between about 0.1 μm and about 10 μm. In some embodiments, separations between adjacent via extension regions in peripheral device region can be in a range about 0.1 μm and about 10 μm. The different dimensions of the via extension regions can provide design flexibility based on the different function and needs of different device regions. For example, by implementing the via extension structure and methods described in the present application, different alignment tolerances can be provided in the staircase region and the peripheral device region by providing varying widths of via extension regions. The varying via extension regions in different device regions can be formed during the same fabrication steps without adding additional fabrication steps or utilize additional masks. In addition, the maximum widths and separations of via extension regions can also be determined by fabrication limitation and design needs. For example, a greater width can provide greater alignment tolerance but a smaller via extension region separation may cause electrical shorting between adjacent via extension regions. In some embodiments, via extension region separation can substantially equal to a critical dimension of the lithography apparatus used to fabricate the 3D NAND memory structure incorporating via extension regions. After via extension regions and openings are formed, the first and second hard masks are removed by any suitable etching processes.

At operation 708, via extension regions and openings are filled with conductive material, in accordance to some embodiments of the present disclosure. In the staircase and peripheral device regions, contact pads are formed in the via extension region and conductive structures are formed in openings. Contact pads and conductive structures can be formed by disposing a conductive material in the exposed via extension regions and openings until the via extension regions and openings are completely filled. A planarization process such as a chemical mechanical polishing process can be used to remove the overflow conductive material such that the top surfaces of the contact pads and the dielectric layer are substantially level. The contact pads and the conductor structures can include conductor materials including, but not limited to, W, Co, Cu, Al, silicides, or any combination thereof. In some embodiments, the conductive material can be disposed using any suitable deposition method such as, for example, for example, CVD, PVD, PECVD, sputtering, MOCVD, ALD, and/or combinations thereof.

At operation 710, forming lead wires and electrically connecting the lead wires to various conductive structures, in accordance to some embodiments of the present disclosure. Lead wires are formed in the staircase and peripheral device regions. Each lead wire is electrically connected to a corresponding contact pad. Lead wires may not be fully aligned with underlying conductive structures since the central axis of lead wires offsets from their respective central axis of the underlying conductive structures. In some embodiments, one or more lead wires are aligned to the NAND string but to various factors such as substrate tensile stress, other lead wires may not fully align to their respective underlying conductive structures. However, the contact pads provide additional alignment window such that electrical connections can be established between lead wires and selected conductive layers as long as the lead wires electrically contact their respective contact pads even if the lead wires are not fully aligned with conductive structures.

The exemplary fabrication method includes forming multiple target via holes in a staircase region and a periphery region of a 3D NAND memory device. Via extension region can be formed at a top end of the target via holes and contact pads are formed to connect to each via in the via extension region. A metal connection can be formed to connect to each via through the corresponding contact pad. In some embodiments, a dual-damascene process can be used to form the contacting structure. The contact pads can be formed simultaneously in the staircase region, and periphery region of the 3D NAND memory device. Contact pads can provide benefits such as enlarged alignment window due to an increased contact surface for subsequent alignment between the adjacent vias. Therefore, the contact pads can reduce potential misalignment risk, which in turn ensures and improves the performance and yield of the 3D NAND memory devices.

In some embodiments, a method for forming a three-dimensional (3D) memory structure includes forming a dielectric layer on a substrate and forming a first plurality of openings in the dielectric layer at a staircase region of the 3D memory structure. The method also includes forming a second plurality of openings in the dielectric layer at a peripheral device region of the 3D memory structure and forming at least one hard mask layer in the first plurality of openings of the staircase region and in the second plurality of openings of the peripheral device region. The method further includes etching the dielectric layer using the at least one hard mask layer to form first and second pluralities of via extension regions in top portions of the respective first and second pluralities of openings. The method further includes disposing a first conductive material in the first and second pluralities of openings to form respective first and second pluralities of contact wires. The method also includes disposing a second conductive material in the first and second pluralities of via extension regions to form first and second pluralities of contact pads and forming first and second pluralities of lead wires on the first and second pluralities of contact pads, respectively.

In some embodiments, a method for forming a three-dimensional (3D) memory structure includes forming a dielectric layer on a substrate and etching the dielectric layer to form a first plurality of openings in a staircase region of the 3D memory structure. The method also includes etching the dielectric layer to form a second plurality of openings in a peripheral device region of the 3D memory structure and disposing a first hard mask layer in the first and second pluralities of openings and on a top surface of the dielectric layer. The method further includes disposing a second hard mask layer on the first hard mask layer and etching the dielectric layer using the first and second hard mask layers to form first and second pluralities of via extension regions in top portions of the respective first and second pluralities of openings. The method also includes disposing a conductive material in the first and second pluralities of via extension regions to form first and second pluralities of contact pads, respectively. The method also includes forming first and second pluralities of lead wires on the first and second pluralities of contact pads, respectively.

In some embodiments, a 3D NAND memory structure includes a substrate having a dielectric layer formed thereon and a staircase region comprising an alternating conductor/dielectric layer stack formed in the dielectric layer. The 3D NAND memory structure also includes a peripheral device region comprising a peripheral device and a plurality of interconnect structures. The plurality of interconnect structures include a first plurality of conductive structures in the staircase region that includes a first plurality of contact pads and a first plurality of contact wires. Each contact wire is electrically coupled to a conductive layer of the alternating conductive/dielectric layer stack. The plurality of interconnect structures also include a second plurality of conductive structures in the peripheral device region. The second plurality of conductive structures include a second plurality of contact pads and a second plurality of contact wires. Each contact wire is electrically coupled to one or more terminals of the peripheral device. The 3D NAND memory structure also includes first and second pluralities of lead wires respectively on the first and second pluralities of contact pads.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory structure, the method comprising:
   forming a dielectric layer;
   forming a first plurality of openings in the dielectric layer at a staircase region of the 3D memory structure;
   forming a second plurality of openings in the dielectric layer at a peripheral device region of the 3D memory structure;
   etching the dielectric layer to form first and second pluralities of via extension regions in top portions of the respective first and second pluralities of openings;
   disposing a first conductive material in the first and second pluralities of openings to form respective first and second pluralities of contact wires;

disposing a second conductive material in the first and second pluralities of via extension regions to form first and second pluralities of contact pads; and forming first and second pluralities of lead wires on the first and second pluralities of contact pads, respectively.

2. The method of claim 1, further comprising disposing first and second hard mask layers in the first plurality of openings of the staircase region and in the second plurality of openings of the peripheral device region.

3. The method of claim 2, wherein the disposing the first hard mask layer comprises disposing the first hard mask layer in the first and second pluralities of openings.

4. The method of claim 2, further comprising performing a planarization process on the first hard mask layer.

5. The method of claim 2, wherein the disposing the first hard mask layer comprises disposing an amorphous carbon layer.

6. The method of claim 2, wherein the disposing the second hard mask layer comprises disposing a silicon oxynitride layer.

7. The method of claim 2, further comprising removing the first and second hard mask layers.

8. The method of claim 1, further comprising performing a planarization process on the first and second pluralities of contact pads such that top surfaces of the dielectric layer and the first and second pluralities of contact pads are substantially level.

9. The method of claim 1, wherein the forming the first and second pluralities of lead wires comprises aligning each lead wire of the first and second pluralities of lead wires to a corresponding contact pad of the first and second pluralities of contact pads.

10. The method of claim 1, wherein the forming the first plurality of openings in the staircase region comprises etching the dielectric layer until an underlying conductive layer is exposed.

11. The method of claim 1, wherein the forming the second plurality of openings in the peripheral device region comprises etching the dielectric layer until a doped region of a transistor is exposed.

12. A method for forming a three-dimensional (3D) memory structure, the method comprising:

forming a dielectric layer;

etching the dielectric layer to form a first plurality of openings in a staircase region of the 3D memory structure;

etching the dielectric layer to form a second plurality of openings in a peripheral device region of the 3D memory structure;

etching the dielectric layer to form first and second pluralities of via extension regions in top portions of the respective first and second pluralities of openings;

disposing a conductive material in the first and second pluralities of via extension regions to form first and second pluralities of contact pads, respectively; and forming first and second pluralities of lead wires on the first and second pluralities of contact pads, respectively.

13. The method of claim 12, further comprising:

disposing a first hard mask layer in the first and second pluralities of openings and on a top surface of the dielectric layer; and disposing a second hard mask layer on the first hard mask layer.

14. The method of claim 13, wherein the disposing the first hard mask layer comprises disposing an amorphous carbon layer.

15. The method of claim 13, wherein the disposing the second hard mask layer comprises disposing a silicon oxynitride material.

16. A 3D NAND memory structure, comprising:

a dielectric layer;

a staircase region comprising an alternating conductor/dielectric layer stack formed in the dielectric layer;

a peripheral device region; and a plurality of interconnect structures, comprising:

a first plurality of conductive structures in the staircase region, comprising a first plurality of contact pads and a first plurality of contact wires; and a second plurality of conductive structures in the peripheral device region, comprising a second plurality of contact pads and a second plurality of contact wires; and first and second pluralities of lead wires respectively on the first and second pluralities of contact pads.

17. The 3D NAND memory structure of claim 16, wherein each contact pad of the first plurality of contact pads is formed in a top portion of each contact wire of the first plurality of contact wires.

18. The 3D NAND memory structure of claim 16, wherein each contact pad of the second plurality of contact pads is formed in a top portion of each contact wire of the second plurality of contact wires.

19. The 3D NAND memory structure of claim 16, wherein a width of each contact pad of the first pluralities of contact pads can be in a range between about 0.3 μm and about 0.6 μm.

20. The 3D NAND memory structure of claim 16, wherein a thickness of each contact pad of the first or second pluralities of contact pads can be in a range between about 0.05 μm and about 0.1 μm.

* * * * *